United States Patent
Yamamoto

(10) Patent No.: US 7,135,081 B2
(45) Date of Patent: Nov. 14, 2006

(54) ADHESIVE TAPE APPLYING METHOD AND APPARATUS

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/730,999

(22) Filed: Dec. 10, 2003

(65) Prior Publication Data

US 2004/0140039 A1 Jul. 22, 2004

(30) Foreign Application Priority Data

Jan. 17, 2003 (JP) ........................... 2003-009652

(51) Int. Cl.
*B32B 31/16* (2006.01)

(52) U.S. Cl. ................ 156/73.6; 156/269; 156/582
(58) Field of Classification Search ................ 156/73.5, 156/73.6, 234, 238, 250, 269, 555, 556, 580, 156/582, 583.1; 264/68
See application file for complete search history.

(56) References Cited

U.S. PATENT DOCUMENTS 3,630,808 A * 12/1971 Yasui ........................ 156/560
4,544,426 A * 10/1985 Stockman .................. 156/73.6

* cited by examiner

*Primary Examiner*—James Sells
(74) *Attorney, Agent, or Firm*—Rader, Fishman & Grauer PLLC

(57) ABSTRACT

An apparatus disclosed relates to a technique for applying adhesive tape to a workpiece. The apparatus includes a chuck table for receiving and holding the workpiece, a tape feeding device for feeding adhesive tape in strip form toward the workpiece held by the chuck table, an applying device for placing an applicator roller in contact with a surface of the adhesive tape and applying the adhesive tape to a surface of the workpiece, and a vibration generating mechanism for vibrating the applicator roller.

18 Claims, 4 Drawing Sheets

ADHESIVE TAPE APPLYING METHOD AND APPARATUS

BACKGROUND OF THE INVENTION (1) Field of the Invention

This invention relates to a technique for applying adhesive tape such as protective tape to surfaces of workpieces such as semiconductor wafers, lead frames or various printed circuit boards.

(2) Description of the Related Art

Methods of planarizing semiconductor wafers (hereinafter simply called "wafers") include mechanical methods such as grinding and polishing (CMP), and chemical methods using etching. When these methods are used to planarize the wafers, protective adhesive tape (hereinafter simply called "protective tape") is applied to the front surfaces of the wafers to protect the wafer surfaces having circuit patterns formed thereon.

In a back-grinding apparatus, for example, the front surface (pattern surface) of a wafer loaded therein is suction-supported by a chuck table and the back surface of the wafer is ground with a grinder. At this time, the back surface of the wafer is ground, with the protective tape applied to the front surface of the wafer to avoid the pattern being damaged under the stress of grinding and to avoid contamination of the pattern.

In processing the back surface of the wafer, the protective tape may not be applied to the front surface of the wafer to have the adhesive of the protective tape filling irregularities, particularly depressions, on the front surface, and to have the surface of the tape in a substantially planar state. Then, the following problems are encountered.

The water used in time of back-surface processing infiltrates into spaces in the depressions. Further, the wafer has a greater overall thickness at elevated portions than at depressed portions. The thicker portions may be ground to be the thinner, resulting in the inconvenience of lowering the accuracy of processing thickness over the wafer surface.

In order to avoid such an inconvenience, it has been conventional practice to increase the pressure of an applicator roller for pressing the adhesive tape on the wafer surface, to heat the wafer through the chuck table and soften the adhesive, thereby facilitating filling of the depressions, or to combine these measures. In this way, an attempt has been made to apply the protective tape reliably even to the irregularities on the patterned surface.

However, both of these measures of increasing the pressure of the applicator roller and heating the wafer invariably apply the protective tape by forcibly deforming the protective tape itself. Consequently, the wafer processed to be thin could be subjected to an increased curvature under the influence of a stress stored in the protective tape forcibly deformed.

Moreover, there have been increased cases in recent years of back-surface processing of wafers, such as flip chips, having bumps formed thereon. Such wafers tend to have increased level differences on the surfaces. Thus, a desire exists for an adhesive tape applying technique capable of coping with such large level differences.

SUMMARY OF THE INVENTION

This invention has been made having regard to the state of the art noted above, and its primary object is to provide a method and apparatus for applying adhesive tape, in which little stress is stored in the adhesive tape in time of application, and the adhesive tape may be applied to workpiece surfaces with high precision.

The above object is fulfilled, according to this invention, by an adhesive tape applying method for placing an applicator member in contact with a surface of adhesive tape and applying the adhesive tape to a surface of a workpiece, the method comprising a step of applying the adhesive tape to the workpiece while vibrating the adhesive tape.

With the adhesive tape applying method according to this invention, the adhesive tape is applied to the workpiece while vibration is applied to the adhesive tape. The vibration causes the adhesive of the adhesive tape to fill level differences of fine irregularities on the surface of the workpiece without forcibly deforming the adhesive tape itself. Thus, the adhesive tape is placed in close contact with the workpiece reliably with no gap formed therebetween. The adhesive tape may also be maintained in a substantially planar state on the surface of the workpiece.

Preferably, vibration is applied to the applicator member or to a holding device for receiving and holding the workpiece. In this way, the adhesive tape may be vibrated by applying vibration to the applicator member or holding device. Since the applicator member is lighter than the holding device, it is preferable to vibrate the lighter applicator member to apply required vibration to where the tape is applied, in that less energy is required for causing the vibration.

In another aspect of the invention, an adhesive tape applying method is provided for placing an applicator member in contact with a surface of adhesive tape and applying the adhesive tape to a surface of a workpiece, the method comprising a step of applying the adhesive tape to the workpiece while heating the adhesive tape.

With this adhesive tape applying method according to this invention, the adhesive tape is heated to soften the adhesive, thereby causing the adhesive to fill level differences on the workpiece with ease. Thus, the adhesive tape is placed in close contact with the workpiece reliably with no gap formed therebetween. The adhesive tape may also be maintained in a substantially planar state on the surface of the workpiece.

It is preferable to heating the holding device. That is, the heat of the heated holding device can heat the adhesive tape through the workpiece placed on the holding device.

Preferably, the applicator member is one or both of an applicator roller and an applicator edge member. By placing the applicator roller or applicator edge member in contact with the surface of the adhesive tape, its pressing force acts substantially uniformly on the adhesive tape to apply the adhesive tape uniformly to the workpiece. The workpiece, preferably, is a semiconductor wafer.

In a further aspect of the invention, an adhesive tape applying apparatus is provided for applying adhesive tape to a surface of a workpiece, comprising a holding device for receiving and holding the workpiece, a tape feed device for feeding the adhesive tape toward the workpiece held by the holding device, an applying device for placing an applicator member in contact with a surface of the adhesive tape and applying the adhesive tape to a surface of the workpiece, and a first vibration generating device for vibrating the applying device.

With the adhesive tape applying apparatus according to this invention, when the adhesive tape is fed to the workpiece placed on the holding device, the first vibration generating device applies vibration to the adhesive tape. In this way, the adhesive tape is applied to the surface of the workpiece while applying vibration to where the tape is applied. Thus, when the applying device applies the adhesive tape to the workpiece while vibration is applied to the tape, the vibration causes the adhesive of the adhesive tape to fill level differences of fine irregularities on the surface of the workpiece without forcibly deforming the adhesive tape itself. As a result, the adhesive tape is placed in close contact with the workpiece reliably with no gap formed therebetween. The adhesive tape may also be maintained in a substantially planar state on the surface of the workpiece.

Preferably, the adhesive tape applying apparatus comprises a heating device for heating the holding device and/or a cutting device for cutting the adhesive tape applied to the workpiece, substantially to a shape of the workpiece. With the heating device, its heat may be conducted to the adhesive tape through the workpiece placed on the holding device, thereby to soften the adhesive. The softened adhesive may fill level differences on the workpiece with ease. The adhesive tape may reliably be maintained in a substantially planar state on the surface of the workpiece. The cutting device is effective to cut the adhesive tape in strip form substantially to the shape of the workpiece without leaving the tape protruding from the workpiece.

Preferably, the first vibration generating device is electromagnetically operable, or is constructed for rotating an eccentric weight. This construction is effective to vibrate the applying device. Consequently, the applying device may apply vibration to the adhesive tape.

Preferably, the adhesive tape applying apparatus further comprises a second vibration generating device for vibrating the holding device. This construction is effective to vibrate the holding device. Thus, the holding device may apply vibration to the adhesive tape.

Preferably, the second vibration generating device is electromagnetically operable, or is constructed for rotating an eccentric weight. This construction is effective to vibrate the holding device. Thus, the holding device may apply vibration to the adhesive tape.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An apparatus for applying protective tape to semiconductor wafers in one embodiment of this invention will be described hereinafter with reference to the drawings.

Figure 1:
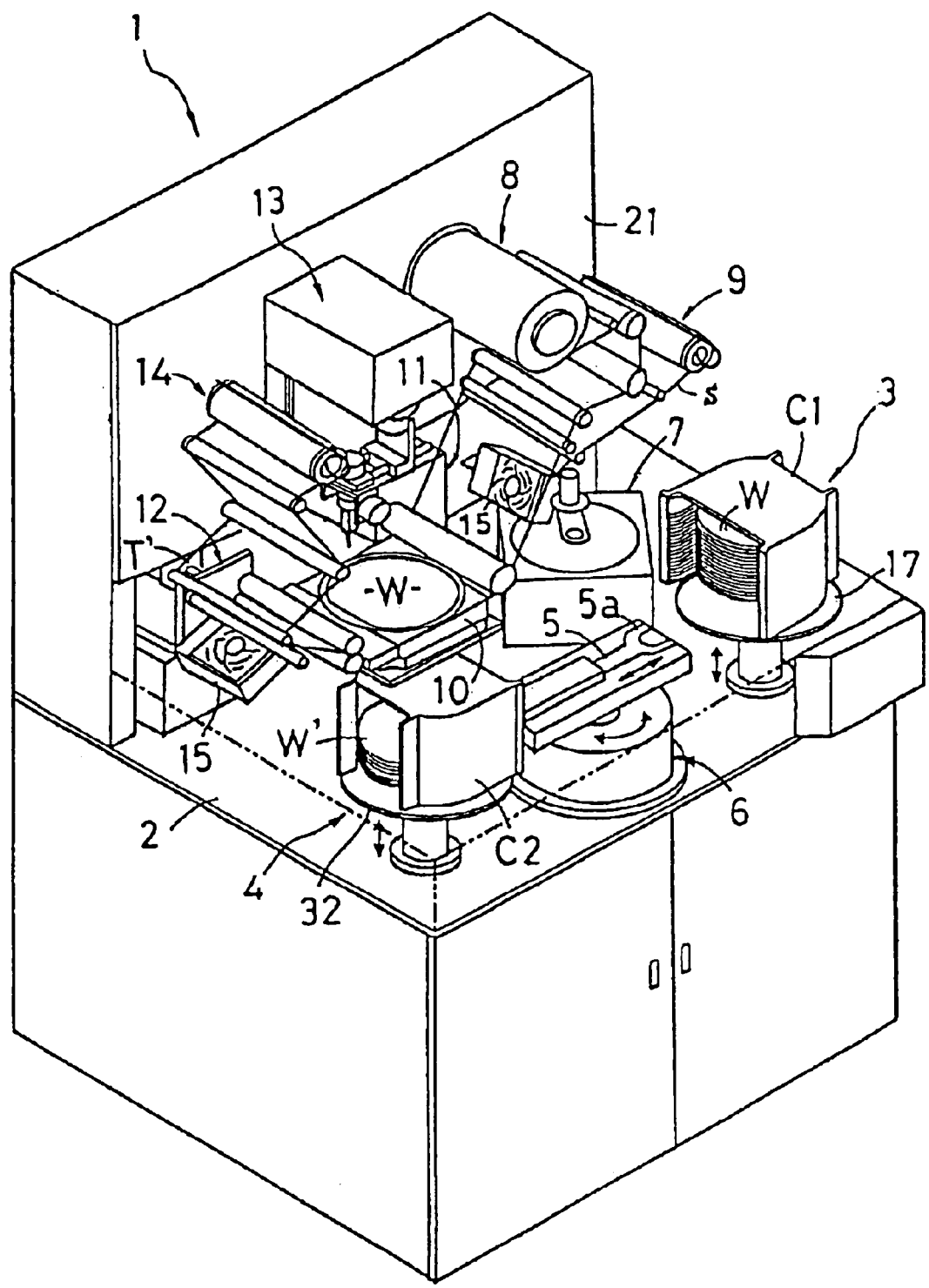
FIG. 1 is a perspective view showing an outline of a protective tape applying apparatus.

FIG. 1 is a perspective view showing an overall construction of a protective tape applying and cutting apparatus.

The protective tape applying and cutting apparatus 1 in this embodiment includes a base 2, and a wafer feeder 3 and a wafer collector 4 arranged on front regions of the base 2. The wafer feeder 3 receives a cassette C1 storing semiconductor wafers (hereinafter simply called "wafers") W which are an example of workpieces. The wafer collector 4 collects processed wafers W' having protective tape T, which is an example of adhesive tape, applied and trimmed to front surfaces thereof. Disposed between the wafer feeder 2 and wafer collector 3 is a wafer transport mechanism 6 having a robot arm 5. An alignment stage 7 is disposed in an inward right-hand position on the base 2, and a tape server 8 is disposed thereabove for feeding the protective tape T toward a wafer W. A separator collector 9 is disposed obliquely rightward below the tape server 8 for collecting only a separator s from the protective tape T with the separator fed from the tape server. To the left of the alignment stage 7 are a chuck table 10 for receiving and suction-supporting a wafer W, a tape applying unit 11 for applying the protective tape T to the wafer W held by the chuck table 10, and a tape separating unit 12 for separating unwanted tape T' after being applied to the wafer W and cut. A tape cutting mechanism 13 is disposed above for cutting off the protective tape T along the contour of wafer W. A tape collector 14 is disposed in a left-hand position above the base 2 for taking up and collecting the unwanted tape T' separated by the tape separator 12. Furthermore, static eliminators 15 are arranged opposite each other across the chuck table 10 for eliminating static electricity from the protective tape T before application to the wafer W and from the unwanted tape T' before collection.

Each mechanism will particularly be described hereinafter.

The wafer feeder 3 includes a vertically movable cassette table 17. The cassette table 17 is constructed to receive thereon a cassette C1 having wafers W stored in multiple stages therein with patterned surfaces facing upward.

The robot arm 5 of the wafer transport mechanism 6 is constructed horizontally extendible and retractable as well as swivelable as a unit. The robot arm 5 has a horse-shoe-shaped wafer holder 5a of the vacuum suction type attached to a distal end thereof. The wafer holder 5a is inserted into a space between wafers W stored in multiple stages in the cassette C1, sucks one of the wafers W by the back surface thereof, takes the wafer W out of the cassette C1, and transports the wafer W to the alignment stage 7, chuck table 10 and wafer collector 4 in the stated order.

The wafer holder 5a is not limited to the above configuration, but may be in any form as long as it is capable of holding a wafer W in a way to avoid deflection that would hamper the suction holding. For example, the wafer holder may have approximately the shape of wafer W for covering the entire surface of wafer W for suction.

The alignment stage 7 receives the wafer W from the wafer transport mechanism 6, and adjusts position of the wafer W based on an orientation flat or notch formed peripherally thereof.

Figure 2:
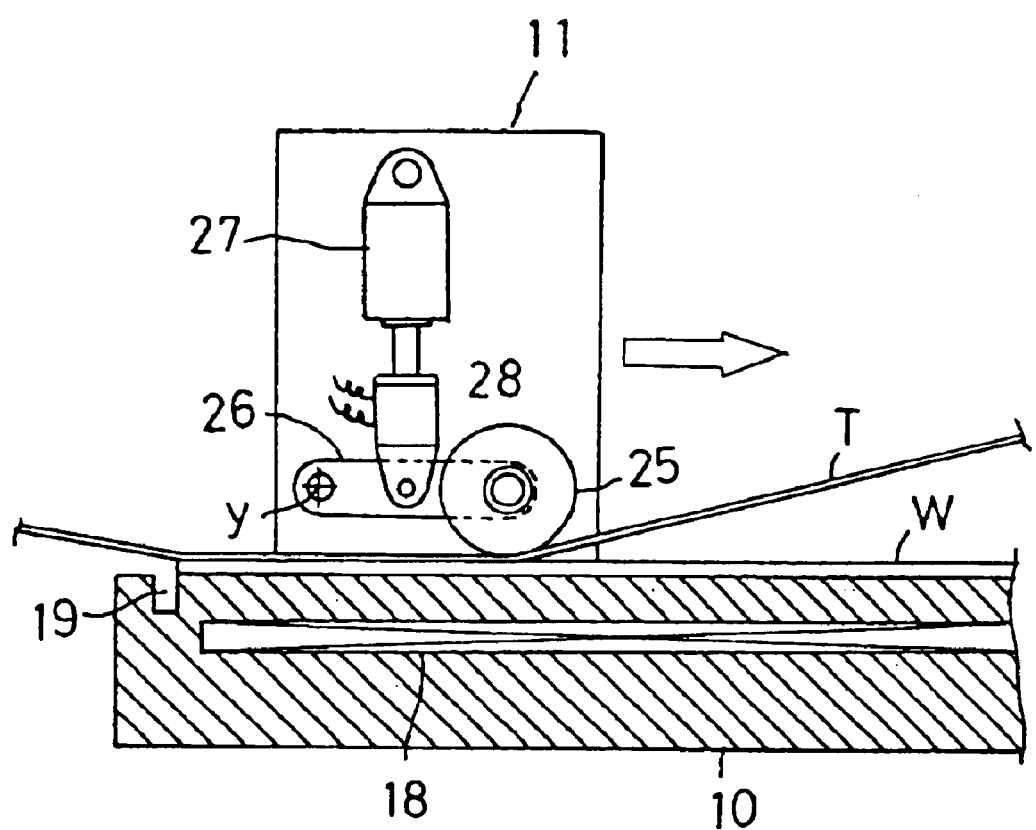
FIG. 2 is a front view of an applying unit.

The chuck table 10 suction-supports the wafer W received as adjusted to a predetermined position from the wafer transport mechanism 6, and has a heater 18 mounted therein as shown in FIG. 2. Further, the chuck table 10 has a cutter raceway groove 19 formed in an upper surface thereof for guiding a cutter 33 of the tape cutting mechanism 13, described hereinafter, to circle along the contour of wafer W to cut the protective tape. The chuck table 10 corresponds to the holding device and the heater 18 to the heating device of this invention.

Figure 3:
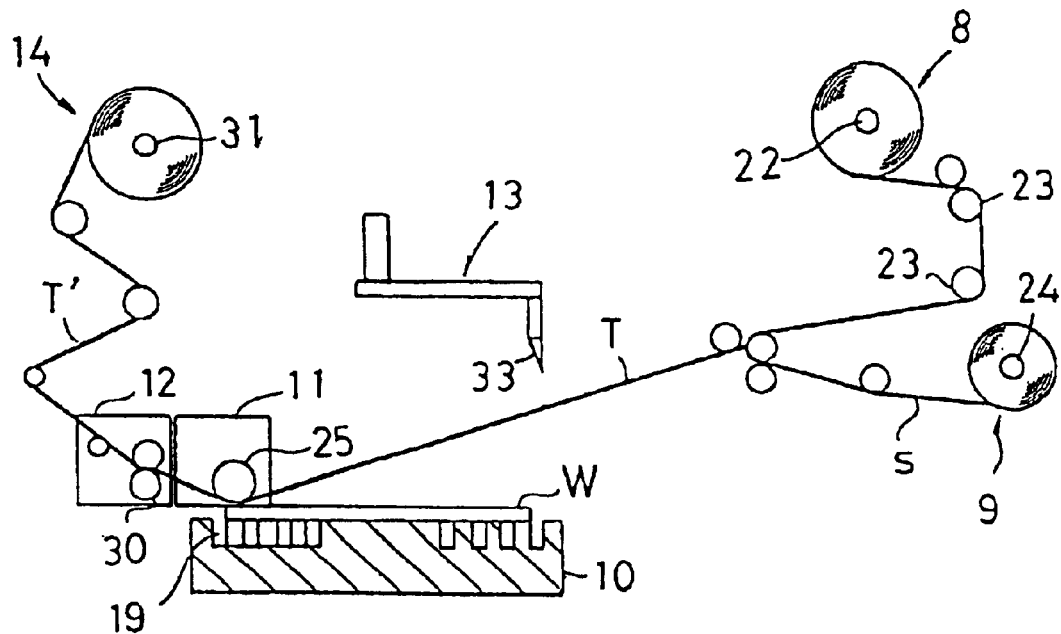
FIG. 3 is a schematic front view showing a protective tape applying process.

As shown in FIG. 3, the tape server 8 guides the protective tape T with separator unwound from a tape bobbin 22 supported by a vertical wall 21 of an apparatus body to guide rollers 23, and guides the protective tape T stripped of the separator s to the tape applying unit 11. An appropriate rotational resistance is applied to the tape bobbin 22 to avoid excessive tape delivery. The tape server 8 corresponds to the tape feeding device of this invention.

The separator collector 9 includes a collecting bobbin 24 supported by the vertical wall 21 of the apparatus body for taking up the separator s separated from the protective tape T. The collecting bobbin 24 is rotatable in a take-up direction by a drive mechanism, not shown, on the back of the vertical wall.

The tape applying unit 11 is horizontally reciprocable right and left by a slide guide mechanism and a screw feed type drive mechanism, not shown, on the back of the vertical wall 21. As shown in FIG. 2, the tape applying unit 11 includes a swing arm 26 attached to a front surface thereof to be vertically swingable about an axis y. The swing arm 26 has an applicator roller 25 acting as an applicator member attached to a free end thereof in a frontally extending cantilever fashion. The tape applying unit 11 corresponds to the applying device of this invention.

The swing arm 26 is swingable up and down by an air cylinder 27. An electromagnetic vibration generating mechanism 28 is interposed between the air cylinder 27 and swing arms 26. This vibration generating mechanism 28 is constructed, when energized, to vibrate the applicator roller 25 vertically. The vibration generating mechanism 28 corresponds to the first vibration generating device of this invention.

Reverting to FIG. 1, the tape separating unit 12 includes a separator roller 30 supported in a frontally extending cantilever fashion. The tape separating unit 12 is horizontally reciprocable right and left by a slide guide mechanism and a screw feed type drive mechanism, not shown, on the back of the vertical wall 21.

The tape collector 14 includes a collecting bobbin 31 supported by the vertical wall 21 of the apparatus body for taking up unwanted tape T'. The collecting bobbin 31 is rotatable in a take-up direction by a drive mechanism, not shown, on the back of the vertical wall.

The wafer collector 4 includes a vertically movable cassette table 32. The cassette table 32 is constructed to receive thereon a cassette C2 for storing, in multiple stages therein, processed wafers W' with the protective tape T applied thereto and unwanted tape cut off.

Next, a series of operations for applying the protective tape T to the surface of wafer W using the above apparatus in this embodiment will be described.

When the cassette C1 containing wafers W in multiple stages is placed on the cassette table 17 of the wafer feeder, the cassette table 17 is moved vertically and stopped at a height for an intended wafer W to be fetched by the robot arm 5.

Next, the wafer transport mechanism 6 swivels to insert the wafer holder 5a of the robot arm 5 into a space between the wafers W in the cassette C1. The robot arm 5, with the wafer holder 5a, takes out the wafer W while suction-supporting the back surface (lower surface) thereof, and transfers the wafer W to the alignment stage 7.

The wafer W placed on the alignment stage 7 is positionally adjusted by using the orientation flat. The positionally adjusted wafer W is held by suction again by the robot arm 5 to be transferred to the chuck table 10.

The wafer W placed on the chuck table 10 is suction-supported after a positional adjustment to have the center thereof registered with the center of the chuck table 10. At this time, as shown in FIG. 3, the tape applying unit 11 and tape separating unit 12 are on standby in leftward initial positions, and the cutter 33 of the tape cutting mechanism 13 in an upper initial position.

Figure 4:
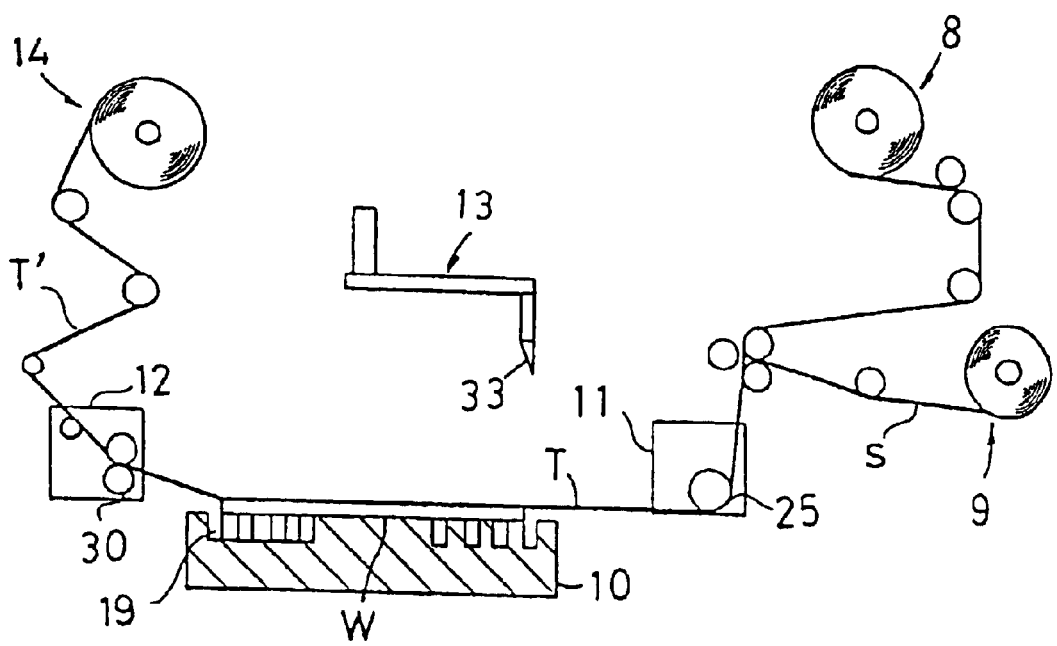
FIG. 4 is a schematic front view showing the protective tape applying process.

After the positional adjustment of the wafer W, as shown in FIG. 4, the applicator roller 25 of the tape applying unit 11 is lowered and rolls on the wafer W in a direction opposite to a tape running direction (from left to right in FIG. 4) while the applicator roller 25 presses down the protective tape T. As a result, the protective tape T is uniformly applied over the entire surface of wafer W. The applicator roller 25 is raised when the tape applying unit 11 reaches a terminal position.

In this applying step, the vibration generating mechanism 28 is energized to vibrate the entire applicator roller 25 vertically, whereby the protective tape T follows minute irregularities on the wafer surface to be applied thereto reliably.

The vibration frequency of the vibration generating mechanism 28 is variable in a range of 300 to 30,000 times/minute, and is preferably about 10,000 times/minute. While the slower traveling speed at this time of the applicator roller 25 provides the higher application performance, about 5 mm/second is practical, considering operating efficiency. The vertical vibrational amplitude of the applicator roller 25 is set and varied according to the thickness of the protective tape, the level difference in irregularities of wafer W, and so on.

Figure 5:
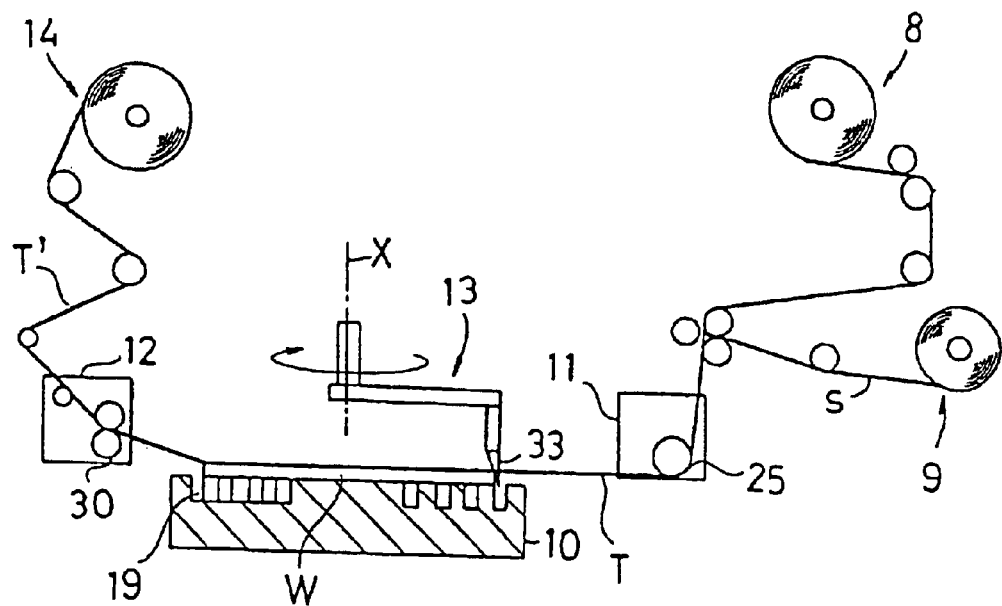
FIG. 5 is a schematic front view showing a protective tape cutting process.

Next, the tape cutting mechanism 13 is lowered and, as shown in FIG. 5, the cutter 33 standing by in the upper position is lowered to a predetermined operative position piercing the protective tape T and lowered to and stopped at a predetermined height.

The cutter lowered to the predetermined height is revolved about a vertical axis X to cut the protective tape T along the wafer contour. At this time, a predetermined tension is applied to the protective tape T by the tape applying unit 11 and tape separating unit 12.

Figure 6:
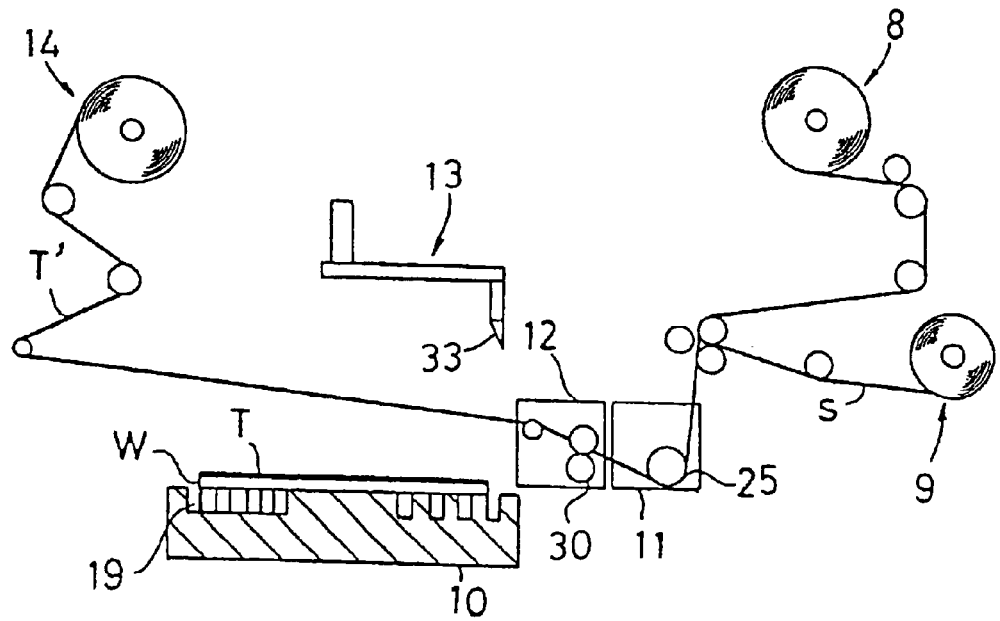
FIG. 6 is a schematic front view showing a protective tape separating process.

When the tape cutting along the contour of wafer W is completed, as shown in FIG. 6, the cutter 33 is raised to the original standby position. Next, the tape separating unit 12, while moving over the wafer W in the direction opposite to the tape running direction, takes up and separates the unwanted tape T' remaining uncut on the wafer W.

When the tape separating unit 12 reaches a separating operation ending position, the tape separating unit 12 and tape applying unit 11 move in the tape running direction to return to the initial positions. At this time, the unwanted tape T' is wound on the collecting bobbin 31, and the protective tape T is drawn in a fixed amount from the tape server 8.

This completes the series of operations for applying the protective tape T to the surface of wafer W. The above operations are repeated thereafter.

As described above, the protective tape T is applied to the wafer W while the vibration generating mechanism 28 applies vibration to the applicator roller 25. This causes the adhesive of the protective tape to fill efficiently the level differences of fine irregularities of the pattern on the surface of wafer W without forcibly deforming the protective tape itself. Thus, the protective tape T may be applied to the wafer W reliably with no gap formed between wafer W and protective tape T. The protective tape may also be applied to the wafer W, with the surface of the protective tape maintained in a substantially planar state.

Further, with the heater 18 mounted in the chuck table 10, the adhesive of the protective tape is heated and softened. The adhesive is thereby allowed to fill the level differences on the wafer W with ease.

This invention is not limited to the foregoing embodiment, but may be modified as follows:

(1) In the foregoing embodiment, the applicator roller 25 is vibrated. A separate, second vibration generating mechanism may be provided for the chuck table 10 to vibrate the chuck table 10 itself.

(2) The first vibration generating mechanism 28 is not limited to the electromagnetic type, but may be any other type as long as it can apply vibration to the applicator roller 25. For example, it is possible to use a construction for rotating an eccentric weight at high speed.

(3) The foregoing embodiment illustrates a case of applying protective tape that protects wafer surfaces. The invention may be applied also to application of an adhesive sheet used in bump bonding.

(4) In the foregoing embodiment, the protective tape in strip form is applied to the wafer W, and thereafter cut approximately to the configuration of wafer W. Instead, protective tape in label form shaped to the wafer configuration beforehand may be applied to the wafer W.

(5) In the foregoing embodiment, the chuck table 10 has the heater 18 mounted therein. The chuck table may be the type without a heater mounted therein.

This invention may be embodied in other specific forms without departing from the spirit or essential attributes thereof and, accordingly, reference should be made to the appended claims, rather than to the foregoing specification, as indicating the scope of the invention.

What is claimed is:

1. An adhesive tape applying method for placing an applicator member in contact with a surface of adhesive tape and applying the adhesive tape to a surface of a workpiece, said method comprising:

a step of applying, with tape applying means, said adhesive tape to said first surface of the semiconductor wafer workpiece is being held at the second surface by suction via the suction holding means, while holding said adhesive tape between said applicator roller and said suction holding means and moving the applicator roller and said suction holding means relative to each other, and while vibrating the applicator roller with vibration generating means and rolling the applicator roller across the surface of said adhesive tape;

said vibration generating means including a swing arm pivotably connected to a connection end of the tape applying means and having an applicator roller attached to a free end of the swing arm remote from the connection end.

2. An adhesive tape applying method as defined in claim 1, wherein vibration is applied to holding means for receiving and holding said workpiece.

3. An adhesive tape applying method as defined in claim 1, further comprising:

a step of applying said adhesive tape to said workpiece while heating said adhesive tape.

4. An adhesive tape applying method as defined in claim 3, wherein said adhesive tape is heated by heating holding means.

5. An adhesive tape applying method as defined in claim 1, wherein said adhesive tape is in strip form.

6. An adhesive tape applying method as defined in claim 1, wherein said adhesive tape is in label form shaped substantially to a shape of said workpiece beforehand.

7. An adhesive tape applying method as defined in claim 1, wherein said workpiece is a semiconductor wafer.

8. An adhesive tape applying apparatus for applying adhesive tape to a first surface of a semiconductor wafer workpiece, the semiconductor wafer workpiece having a second surface disposed opposite the first surface, comprising:

suction holding means for receiving said semiconductor wafer workpiece and holding the semiconductor wafer workpiece at the second surface;

tape feed means for feeding the adhesive tape toward the semiconductor wafer workpiece held by said suction holding means;

applying means for rolling an applicator roller in contact with a surface of the adhesive tape and applying the adhesive tape to the first surface of the semiconductor wafer workpiece; and first vibration generating means for vibrating saidapplicator roller when the applicator roller rolls across the surface of said adhesive tape;

wherein said first vibration generating means includes a swing arm pivotably connected to a connection end of the tape applying means and having an applicator roller attached to a free end of the swing arm remote from the connection end; and said adhesive tape is applied to the first surface of the semiconductor wafer workpiece being held at second surface by said suction holding means, while said adhesive tape is held between said applicator roller and said suction holding means and the applicator roller and said suction means are moved relative to each other, and while said adhesive tape is vibrated.

9. An adhesive tape applying apparatus as defined in claim 8, further comprising heating means for heating said suction holding means.

10. An adhesive tape applying apparatus as defined in claim 8, further comprising cutting means for cutting the adhesive tape applied to said workpiece, substantially to a shape of said semiconductor wafer workpiece.

11. An adhesive tape applying apparatus as defined in claim 8, wherein said first vibration generating means is electromagnetically operable.

12. An adhesive tape applying apparatus as defined in claim 8, further comprising second vibration generating means for vibrating said suction holding means.

13. An adhesive tape applying apparatus as defined in claim 12, wherein said second vibration generating means is electromagnetically operable.

14. An adhesive tape applying apparatus as defined in claim 12, wherein said second vibration generating means is constructed for rotating an eccentric weight.

15. An adhesive tape applying apparatus as defined in claim 8, wherein said adhesive tape is in strip form.

16. An adhesive tape applying apparatus as defined in claim 8, wherein said adhesive tape is in label form shaped substantially to a shape of said workpiece beforehand.

17. An adhesive tape applying apparatus as defined in claim 8, wherein said workpiece is a semiconductor wafer.

18. An adhesive tape applying apparatus as defined in claim 8, wherein said first vibration generating means is constructed for rotating an eccentric weight.

* * * * *